United States Patent
Weingarten et al.

(10) Patent No.: US 10,079,068 B2
(45) Date of Patent: Sep. 18, 2018

(54) DEVICES AND METHOD FOR WEAR ESTIMATION BASED MEMORY MANAGEMENT

(75) Inventors: Hanan Weingarten, Herzelia (IL); Avi Steiner, Kiryat Motzkin (IL)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 898 days.

(21) Appl. No.: 13/342,946

(22) Filed: Jan. 3, 2012

(65) Prior Publication Data

US 2012/0216085 A1 Aug. 23, 2012

Related U.S. Application Data

(60) Provisional application No. 61/445,729, filed on Feb. 23, 2011.

(51) Int. Cl.
| | | |
|---|---|---|
| G11C 29/08 | (2006.01) | |
| G06F 11/26 | (2006.01) | |
| G11C 16/34 | (2006.01) | |
| G11C 29/02 | (2006.01) | |
| G11C 29/50 | (2006.01) | |
| G11C 11/56 | (2006.01) | |
| G11C 16/00 | (2006.01) | |

(52) U.S. Cl.
CPC ......... *G11C 16/349* (2013.01); *G11C 29/028* (2013.01); *G11C 29/50004* (2013.01); *G11C 11/56* (2013.01); *G11C 16/00* (2013.01); *G11C 2029/5002* (2013.01)

(58) Field of Classification Search
CPC ......... G11C 29/56; G11C 29/48; G11C 29/44; G11C 29/50; H05K 999/99
USPC .......... 714/718; 711/103, E12.001, E12.008, 711/141, E12.026
See application file for complete search history.

(56) References Cited

U.S. PATENT DOCUMENTS

| | | |
|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |

(Continued)

OTHER PUBLICATIONS

Singh, M., et al., "Global Roadmap for Ceramic and Glass Technology with CD-ROM", John Wiley &Sons, pp. 314-316, Jun. 2007.*

(Continued)

*Primary Examiner* — Kyle Vallecillo
(74) *Attorney, Agent, or Firm* — Sheridan Ross P.C.

(57) ABSTRACT

A system, a non-transitory computer readable medium and a method for wear estimation of a flash memory device, the method may include: programming information to a first portion of the flash memory device during a test programming process; measuring a duration of the test programming process; and estimating a wear characteristic of the first portion of the flash memory device thereby providing an estimated wear characteristic, wherein the estimating is responsive to the duration of the test programming process.

32 Claims, 8 Drawing Sheets

(56) References Cited

U.S. PATENT DOCUMENTS

| | | |
|---|---|---|
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1* | 8/2008 | Gollub ................ 714/718 |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |

(56) References Cited

U.S. PATENT DOCUMENTS

| | | |
|---|---|---|
| 2009/0113275 A1 | 4/2009 | Chen et al. |
| 2009/0125671 A1 | 5/2009 | Flynn et al. |
| 2009/0144598 A1* | 6/2009 | Yoon et al. ............... 714/752 |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1* | 11/2009 | Van Cauwenbergh ....... 711/103 |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0149881 A1 | 11/2010 | Lee et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0093659 A1* | 4/2011 | Jo et al. ............... 711/141 |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1* | 5/2012 | Goss et al. ............... 711/103 |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder"(a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association JEDEC Standard No. 47F pp. 1-26, Dec. 2007.
Dempster, et al., "Maximum Likelihood from Incomplete Data via the EM Algorithm", Journal of the Royal Statistical Society Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

(56) References Cited

OTHER PUBLICATIONS

Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-13 28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

DEVICES AND METHOD FOR WEAR ESTIMATION BASED MEMORY MANAGEMENT

RELATED APPLICATIONS

This application is a NONPROVISIONAL of, claims priority to and incorporates by reference U.S. provisional patent application No. 61/445,729, filing date Feb. 23, 2011 which is incorporated herein by reference.

BACKGROUND OF THE INVENTION

A NAND flash memory array includes rows and columns (strings) of cells. A cell may include a transistor. During a read operation, an entire row/page of the NAND flash memory array is read. This is done by applying a bias voltage to all rows not being read and a reference threshold voltage to the row that should be read.

The bias voltage allows the transistor of the NAND flash memory array to fully conduct. The cells lying on the row being read will conduct only if the threshold voltage is sufficiently high to overcome the trapped charge in the floating gate.

A sense amplifier is connected to each string which measures the current through the string and outputs either a "1" or a "0" depending whether the current passed a certain threshold.

Typically, a programming operation includes a process of multiple small charge injection steps. A charge may be injected to a cell by applying a voltage pulse (Vpulse), to the row being programmed and setting the gate voltages of all other transistors in the string to a bias voltage (Vbias).

After applying a voltage pulse, the programmed cell is read (using the procedure described above) and compared to the desired programming voltage. If the desired programming voltage is reached, the programming ends. Else, additional pulses are provided—until reaching the desired programming voltage or until reaching a maximal number of pulses (Nmaxpulses). If, after the maximal number of pulses is used, there remain cells that did not pass the verify test (were not programmed to the desired programming voltage), a program error (or failure) can be declared.

The programming process includes increasing the level of the voltage pulses (Vpulse) by a voltage increment known as Vstep.

The programming parameters (e.g. Vbias, Vstep, Vstart, and Nmaxpulses) can be defined to provide a desired trade-off between speed and accuracy. Thus, higher Vstep and Vstart can assist in speeding up the programming process but may not be fitted to provide very narrow voltage threshold distribution lobes. Also, higher Nmaxpulses will reduce the chances of programming failures while lower Nmaxpulses shorten the programming process.

The above described programming procedure may be applied when programming a single bit per cell, or two or more bits per cell. If a single bit per cell is programmed, the programming pulses would typically be applied only to strings with corresponding data bits equal to zero.

In a multi-level Flash device pages are separated by n-levels, corresponding to the number of bits stored per cell.

A three bits per cell flash memory array can be programmed to store Most Significant Bit (MSB) pages, Central Significant Bit (CSB) pages and Least Significant Bit (LSB) cells.

FIG. 1 illustrates eight voltage threshold distribution lobes (lobes) 11-18, starting from an erase lobe (the leftmost lobe) and ending at the highest value lobe 18. FIG. 1 also illustrates a MSB read threshold 24 (positioned between the fourth and fifth lobes), two CSB read thresholds 22 and 26 and four LSB read thresholds 21, 23, 25 and 27.

As may be noticed from FIG. 1, for reading an MSB page, only a single threshold comparison (to MSB read threshold 24) should be performed. For reading a CSB page, two CSB read thresholds 22 and 26 are to be used in order to determine the bit value of every CSB associated cell. For LSB pages the bit-values are determined using the four LSB read thresholds 21, 23, 25 and 27.

An MSB page is read by using the MSB read threshold 24. All threshold voltages that belong to lobes (15-18) above the MSB read threshold 24 will be read as "0"s and all threshold voltages that belong to lobes (11-14) below the MSB read threshold 24 will be read as "1"s.

A CSB page is read by using two CSB read thresholds 22 and 26. All threshold voltages that belong to lobes (11 and 12) below the first CSB read threshold 22 and all threshold voltages that belong to lobes above (17 and 18) the second CSB read threshold 26 level will be read as "1"s. All threshold voltages that belong to lobes (13-16) between the two CSB read thresholds 22 and 26 will be read as "0"s. Similarly, the LSB pages are read by applying four LSB thresholds 21, 23, 25 and 27.

The lobes of FIG. 1 are non-overlapping, however this is only schematic, and in practical cases the lobes may overlap. The overlapping can be intentional (for obtaining higher programming speed), or due to the retention effect.

The programming and erasing of flash memory cells cause unwanted charges to be trapped in the flash memory cells. These charges can introduce errors in the programming and reading processes.

After long periods or after multiple program and erase cycles the lobes tend to widen, to move to the left (towards lower voltage threshold levels) and in many cases to overlap due to trap charge leakage. This phenomenon is also known as detrapping or retention effect. Flash memory cells that are more affected by the retention effect can be considered as being worn. The wear level of a cell can be at least partially reduced due to trap charge discharge.

Due to the retention, the read thresholds should change over time in order to at least partially compensate for the change in the lobes' distribution.

SUMMARY OF THE INVENTION

In an embodiment of the present invention, a method may be provided and may include programming information to a first portion of the flash memory device during a test programming process; measuring a duration of the lest programming process; and estimating a wear characteristic of the first portion of the flash memory device thereby providing an estimated wear characteristic, wherein the estimating is responsive to the duration of the test programming process.

The test programming process may include programming test information, wherein the test programming process may be dedicated solely for the estimating of the wear characteristic.

The information may be random information having a random content or pseudo-random information generated by a pseudo-random process.

The information may be selected to include a substantially same amount of zero valued bits and one valued bits.

The programming of the information may include applying multiple types of programming that differ from each other by significance.

The method may include triggering the test programming process in a random or pseudo-random manner.

The method may include triggering the test programming process in response to events selected from: (a) an occurrence of read errors of data previously programmed to the flash memory device, (b) reaching a predefined number of program and erase cycles of the first portion of the Plash memory device, (c) detecting another portion of the flash memory device that has a wear level of a predetermined value, (d) a failure in evaluating a wear level of another portion of the flash memory device, and (e) a success in evaluating a wear level of another portion of the flash memory device.

The method may include programming non-test information using first programming parameters and programming the information, during the test programming process, using second programming parameters that differ from the first programming parameters; wherein each of the first and second programming parameters include at least one out of an initial programming voltage, an allowable number of programming steps, a bias voltage supplied to flash memory cells that are not programmed, a maximal programming voltage and a programming voltage step.

The information may be non-test information that may be scheduled to be programmed to the flash memory module even at an absence of the test programming process.

The method may include: programming the non-test information during the test programming process; storing the non-test information in a buffer; checking if the programming of the non-test information succeeded; deleting the non-test information from the buffer if the programming of the non-test information succeeded; and re-programming the non-test information if the programming of the non-test information failed.

The method may include re-programming the non-test information to another portion of the flash memory device.

The method may include re-programming the non-test information while using at least one programming parameter that differs from a programming parameter used during the programming of the non-test information.

The method may include determining whether to re-program the non-test information in response to the wear characteristic evaluated during the evaluating of the wear characteristic.

The method may include receiving non-test information to be programmed during the test programming process, wherein the non-test information may be encoded with an error correction code that may be stronger than an error correction code applied on non-test information that may be programmed during a non-test programming process.

The method may include applying a first error correction code to generate non-test information to be programmed during the test programming process; and applying a second error correction code to generate non-test information to be programmed during a non-test programming process; wherein the first error correction code may be stronger than the second error correction code.

The method may include programming the information while using first programming parameters; determining values of third programming parameters based upon the estimated wear characteristic; and programming additional information while using the third programming parameters.

The programming of the information may include utilization of programming parameters that emphasize differences between wear characteristics of different portions of the flash memory device.

The method may include funding programming parameters that emphasize differences between wear characteristics of different portions of the flash memory device.

The method may include altering at least one programming parameter during the test programming period.

The method may include allocating portions of the flash memory device for programming based upon estimated wear characteristics of the portions of the flash memory device.

The allocating may include applying a wear balancing scheme.

The allocating may include allocating the first portion of the flash memory device to store an information entity that may be expected to be stored for a first term; and allocating another portion of the flash memory device to store another information entity that may be expected to stored for a second term; wherein the first term may be longer than the second term and the estimated wear characteristics of the first and second portions of the flash memory device indicate that the first portion of the flash memory device may be less worn than the second portion of the flash memory device.

The method selecting programming parameters to be used when programming non-test information in response to the estimated wear characteristic.

The method may include performing multiple sets of test programming processes on multiple portions of the flash memory device in proximity to a beginning of a lifetime of the flash memory device; wherein different portions of the flash memory devices undergo different amounts of test programming processes; wherein the test programming processes of each set are executed in a continuous manner, wherein durations of the multiple sets of test programming process are measured to provide multiple durations; and generating, in response to the multiple durations, a time to wear mapping.

The method may include selecting, out of the multiple durations, a subset of durations, as a time to wear mapping.

The method may include executing each set of test programming processes without long idle periods between adjacent test programming processes of the set such as to prevent substantially charge trap discharge.

Further embodiments of the invention include a computer readable medium that is non-transitory and may store instructions for performing the above-described methods and any steps thereof, including any combinations of same. For example, the computer readable medium may store instructions for execution by one or more processors or similar devices, which instructions, when executed, result in, cause or facilitate programming information to a first portion of the flash memory device during a test programming process; measuring a duration of the test programming process; and estimating a wear characteristic of at least the first portion of the flash memory device thereby providing an estimated wear characteristic, wherein the estimating of the wear characteristic may be response to the duration of the test programming process.

Additional embodiments of the invention include a system arranged to execute any or all of the methods described above, including any stages and any combinations of same. For example, the system may include a memory controller and a flash memory device; wherein the memory controller may be arranged to program information to a first portion of the flash memory device during a test programming process; measure a duration of the test programming process; and estimate a wear characteristic of at least the first portion of the flash memory device thereby providing an estimated wear characteristic, wherein the estimate of the wear characteristic may be responsive to the duration of the test programming process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
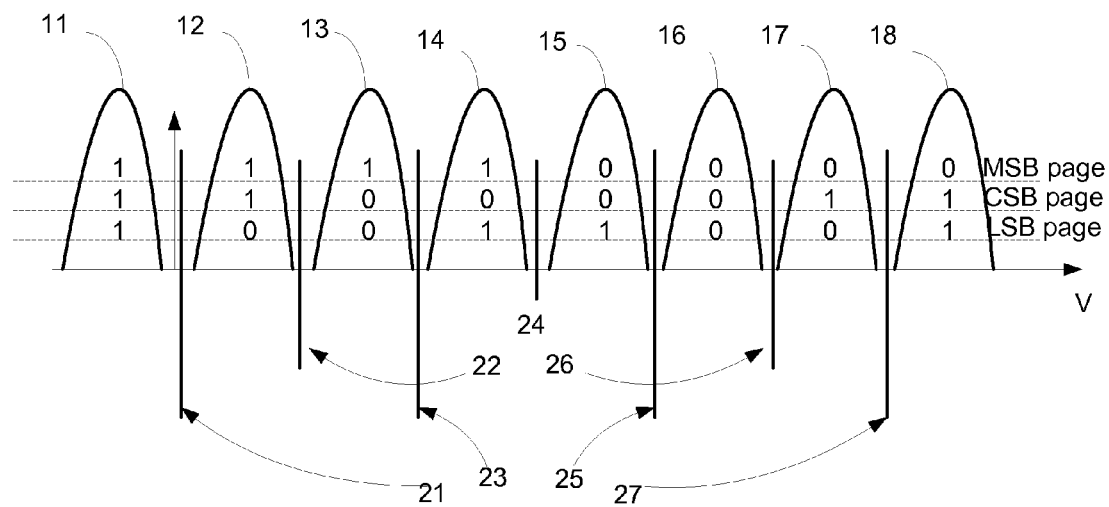
FIG. 1 schematically illustrates a conventional 3 bpc Flash device threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Wear estimation is provided that is responsive to the duration of a test programming process. This wear estimation is more accurate than program erase cycle count as the latter does not take into account various phenomena such as trap charge discharge (known also as de-trapping). Thus, the wear estimation can allow using a flash memory device even after reaching a maximal allowable program erase count value.

Wear Estimation

It has been found that the program erase cycle count alone can not provide an accurate estimate of the wear level of flash memory cells. This deficiency may result from a flash memory recovery (also known as recuperate).

For example, consider the following two scenarios. In the first scenario, a flash memory block underwent a process of P/E cycles over a short period of time before the last programming operation occurred. In the second scenario, the flash memory block has undergone the same number of P/E cycles but these P/E cycles ended a very long time before the last programming operation. The wear (as seen during the last programming operation) in the first scenario may be more significant than the wear in the second scenario because the flash memory block has a shorter time to recover.

A system, a device, a method and a computer readable medium that is non-transitory and may be a computer program product (or a part of the computer program product) are provided for estimating a wear characteristic such as a wear level of flash memory cells. The method can be executed by the device or by the system and the computer program product can include a non-transitory computer readable medium for storing code that one executed by a computer will result in the execution of the method.

The method may include measuring the duration of a test programming process and evaluating the wear level based on the measurement. The test programming process is a programming process during which the wear level is tested.

The estimation of the wear level can be also responsive to status information such as program erase cycle count, last time of programming or a combination thereof.

A shorter test programming process duration indicates that a flash memory block is more worn.

The test programming process can be dedicated for testing the wear level but can also replace a normal programming process—when it is used to program information that should be programmed to the flash memory block regardless of the wear level measurement. The information that is being programmed can be (or can include) test information (which is dedicated for the test programming process) or non-test information (that was scheduled to be programmed to the flash memory device even at an absence of the test programming process. The latter is also referred to as normal information—as it should be programmed to the flash memory device during the normal operation of the flash memory device.

The test programming process can occur off line—during dedicated test periods in which test information is programmed. Alternatively, the measurement can be done on-line—during the normal operation of the flash memory device. The term normal indicates an operation that is not solely dedicated for wear estimation.

The test programming process can involve programming predefined information, random information, pseudo-random information, or normal information. It is expected that due to the arbitrary nature of information that the duration of the programming process will be indifferent to the value of information being programmed—thus different information can be programmed during different programming processes.

The amount of information to be programmed during the test programming process can be selected to be long enough so that statistically different information will include substantially the same amount of one valued bits ("1") and zero valued bits ("0"), and contain sufficient statistics on the physical Flash blocks over time. That is, it might be required to program to several pages and, additionally or alternatively, different types of programming that differ by their significance (such as most significant bit programming, central significant bit programming and least significant bit programming) to gain a sufficiently accurate estimation of the average programming time for the wear estimation. However, the estimation accuracy may be traded for the performance penalty involved with the test, such that the number of test programmed pages is minimized as to provide predefined estimation accuracy.

The wear level measurements can be executed in a periodical manner, in a pseudo-random manner, in a random manner (in random points of time).

Additionally or alternatively, the wear level measurements can be triggered by events such as read errors, programming failures, program and erase cycles values, failures (or successes) in evaluating wear levels, wear levels of other flash memory blocks.

The test programming process can be executed before first programming a flash memory block after the erasing of that flash memory block.

The programming process can be executed while using the same programming parameters as those selected for normal program operations. The term normal program operations are programming operations that are not dedicated for wear estimation.

Alternatively, one or more programming parameters of the programming processes can differ from those of the normal programming operations. The programming parameters may include, for example, the number of bits per cell, Vstart, Vstep, Vbias and Nmaxpulses. For example, the test programming process may include single level programming (which is faster than multi-level programming) while the normal programming includes 3 bits per cell programming.

According to an embodiment of the invention the test programming process includes programming normal information. This normal information (as opposed to dedicated test information) should not be corrupted as a result of the wear level measurement.

In order to prevent such a corruption one or more measures can be taken:
 i. The normal information can be stored in a buffer until verifying that the test programming process succeeded.
 ii. If the test programming process failed (the normal information was corrupted or includes too much errors) the normal information can be programmed to another location using programming parameters that will increase the chances of programming success (for example—using lower Vstep and Vstart values).
 iii. Encoding the normal information with error correction codes (ECC) that are stronger than the usual ECC. That is, for example, allocate smaller payload size per page and encode with more redundancy, with possibly a code configuration which may provide reliability for higher read error rates.

Thus, when the programmed data may be normal data (for example—user data), where in case of reliability risk (wear estimation from programming is higher than assumed); the data can be reprogrammed to a different address with modified parameters, which correspond to the wear estimation. In case the assumption was correct, or no reliability risk is evident the programmed data remains, and the wear estimation involves no overhead. Alternatively, if the programmed data is protected with a stronger ECC, even a failure in wear estimation does not require a re-programming, and read-out will be reliably done relying on the capabilities of the effectively stronger ECC. The only penalty here is that payload per write for wear estimation is smaller than the usual payload since more redundancy has to be allocated for obtaining a stronger ECC.

According to an embodiment of the invention each normal programming may be preceded by an initial evaluation of the wear level of the target flash memory block. The initial estimation may be responsive to measured wear levels of other flash memory blocks, to previous measurements of wear level of the target flash memory block and the like. The initial evaluation can be followed by tailoring the programming parameters and additionally or alternatively, the error correction code to this initial evaluation of the wear level. Once the test programming process of the target flash memory block is completed the initial evaluation can be updated.

Yet according to another embodiment of the invention excess programming operations can be avoided by programming flash memory blocks using a stronger ECC—if the wear level of the target flash memory block is not known— or was not measured for a long period. This way the programmed data can be reliably read even before measuring the wear level of the target flash memory block.

According to various embodiments of the invention the test programming process can be executed while maintaining the values of the programming parameters during the entire test programming process. Yet for another embodiment of the invention, one or more programming parameter can be changed during the test programming process. For example, a test programming process can include several write operations with different Vstart values (or other programming parameters).

According to an embodiment of the invention the programming parameters of the test programming process can be selected such as to emphasize the difference in the wear levels of different flash memory blocks. For example—the test programming process can include programming a flash memory block (or a portion thereof) to threshold voltage levels that are more affected by the charge traps. For example—the flash memory block can be programmed to the highest lobe.

In order to emphasize the difference in the wear levels of different flash memory blocks the test programming period can be increased so that difference between flash memory blocks will increase. This may include—increasing the target programming threshold voltage, decreasing Vstep, decreasing Vstart, increasing Nmaxpulses and lowering Vbias.

Figure 3:
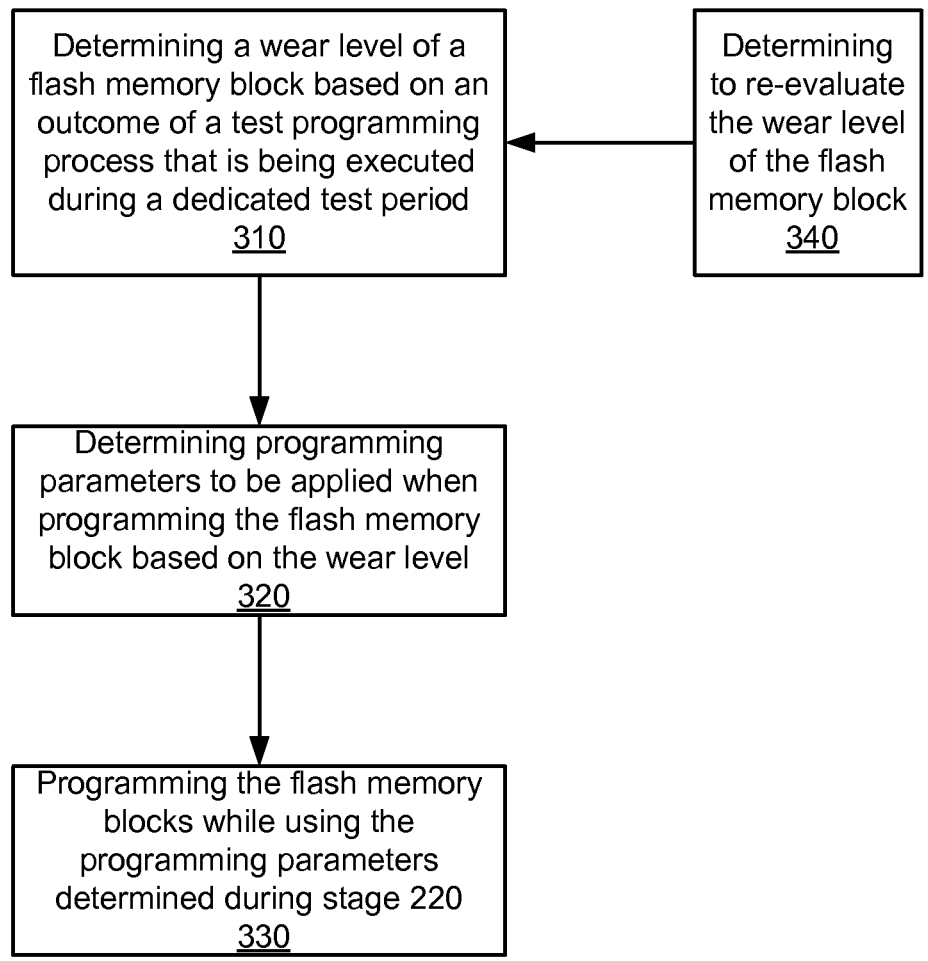
FIG. 3 illustrates a method according to an embodiment of the invention.

It is noted that the programming parameters can be changed until a significant (or at least a visible) difference between flash memory blocks is shown. Typically, flash memory blocks that have undergone wear may not be affected. For example, we may start to lower Vstart until there is a considerable change in the programming time. The wear of the block may define the Vstart at which the change is detected (as illustrated in FIG. 3). There may be a need to increase Nmaxpulses in order to allow some of these measurements.

Although the wear level of a flash memory block is evaluated the test programming process may include programming one or more pages of the flash memory block. The number of flash memory pages that are programmed during the test programming process can be the same for each flash memory block and for each test programming process but this is not necessarily so. The flash memory pages that are programmed during the test programming process may be selected in a random manner, in a pseudo-random manner or according to a predefined manner.

If multiple flash memory pages of a flash memory block are programmed and their programming duration is measured than the wear level of the entire flash memory block can be estimated in response to the programming durations of the different flash memory pages. Any function can be applied including averaging, weighted sum and the like.

If multiple flash memory pages are programmed then the programming parameters can be the same but may differ from one flash memory page to another.

According to an embodiment of the invention an initial test programming process can be executed before a manufactured flash memory die is shipped to a customer. This initial test programming process can be used as a reference to other test programming processes of the same die, taken during the lifespan of the die.

The initial test programming process may include measuring program times on several un-cycled blocks per flash memory die. It may also be possible to further measure the programming time of cycled blocks, depending on the time allotted for the initial test programming process. These measurements may then be used as a reference for wear measurement during the life cycle of the flash memory die.

Figure 2:
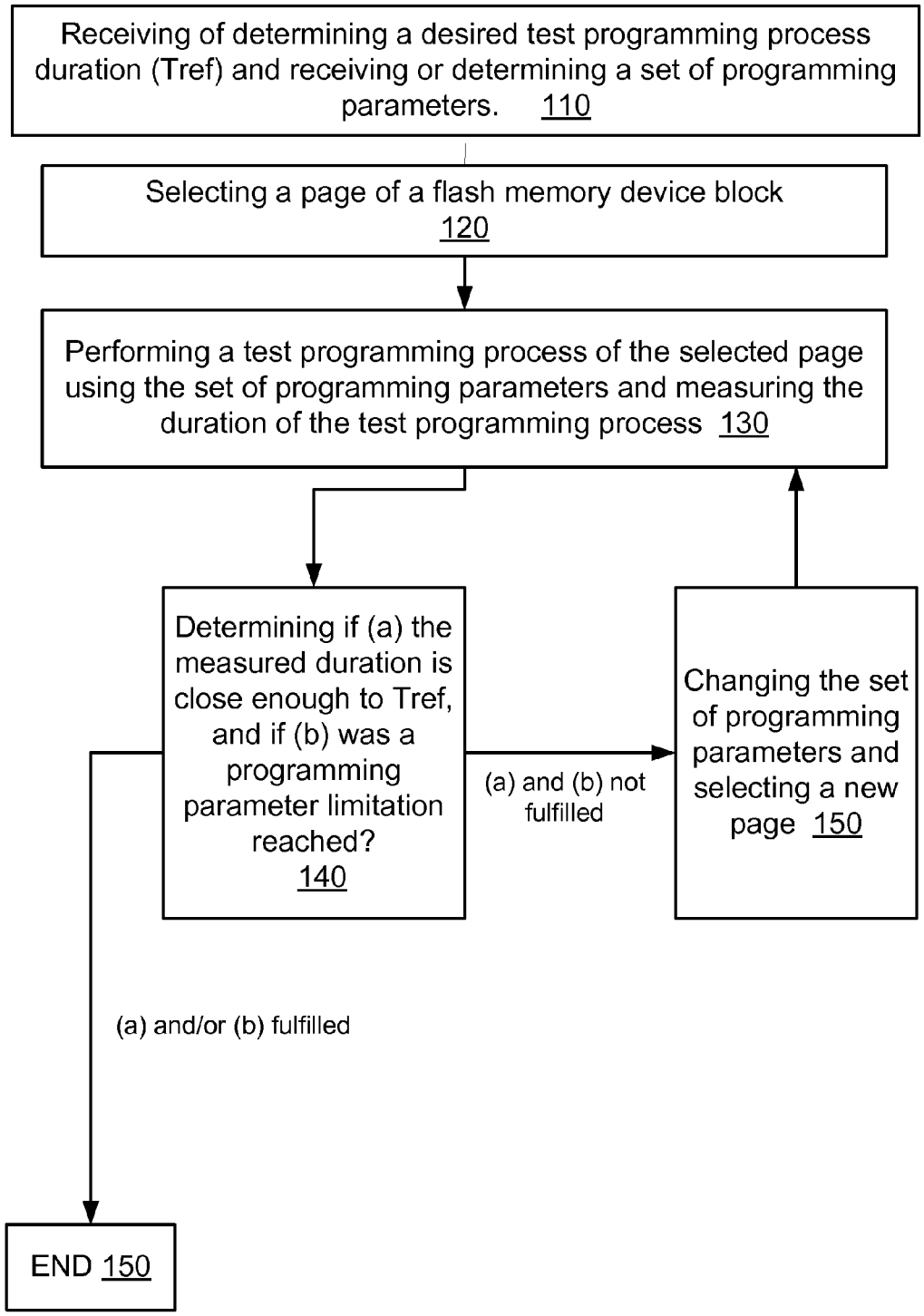
FIG. 2 illustrates a method according to an embodiment of the invention.

FIG. 2 illustrates method 200 according to an embodiment of the invention. Method 200 is a calibration process during which a set of programming parameter is found that results in a desired duration of a test programming process. The calibration process can be executed at the beginning of the life of the flash memory device or when a set of parameters should be changed according to an adaptive programming algorithm. Note, the programming parameters for every effective cycle range is pre-determined and set offline for a family of devices. So is the programming time estimation for every effective cycle count. It is set for a family of devices during the sort process which is done during manufacturing. In a product, the programming parameters can be received from the testing during the sort process.

Method 200 starts by stage 110 of receiving or determining a desired test programming process duration (Tref) and receiving or determining a set of programming parameters.

Stage 110 is followed by stage 120 of selecting a page of a flash memory device block.

Stage 120 is followed by stage 130 of performing a test programming process of the selected page using the set of programming parameters and measuring the duration of the test programming process.

Stage 130 is followed by stage 140 of determining if (a) the measured duration is close enough to Tref, and if (b) was a programming parameter limitation reached.

A programming parameter limitation can indicate that the set of programming parameters should not be further changed. For example, if the changing of the set of programming parameters includes changing the initial programming voltage Vstart then the limitation can be reached when Vstart reaches a maximal allowable value or any value that should not be further increased.

If (a) is not fulfilled and (b) is not fulfilled than stage 140 is followed by stage 150 of changing the set of programming parameters and selecting a new page. Stage 150 is followed by stage 130.

If at least one of (a) and (b) is fulfilled then the process ends—as illustrated by stage END 150.

Different Vstart values yield different program times, it is possible to estimate the wear level by checking what Vstart produces a reference program time. That is, when device is at the beginning of life, it may require a high Vstart to achieve program time Tref, while for cycled blocks a lower Vstart may provide a program time of Tref.

FIG. 3 illustrates method 300 according to an embodiment of the invention.

Method 300 starts by stage 310 of determining a wear level of a flash memory block based on an outcome of a test programming process that is being executed during a dedicated test period.

Stage 310 is followed by stage 320 of determining programming parameters to be applied when programming the flash memory block based on the wear level.

Stage 320 is followed by stage 330 of programming the flash memory blocks while using the programming parameters determined during stage 320.

Method 300 also includes stage 340 of determining to re-evaluate the wear level of the flash memory block Stage 340 is followed by stage 310. As indicated above the re-evaluation can be triggered in a periodical manner, in a random manner, in response to events and the like.

Figure 4:
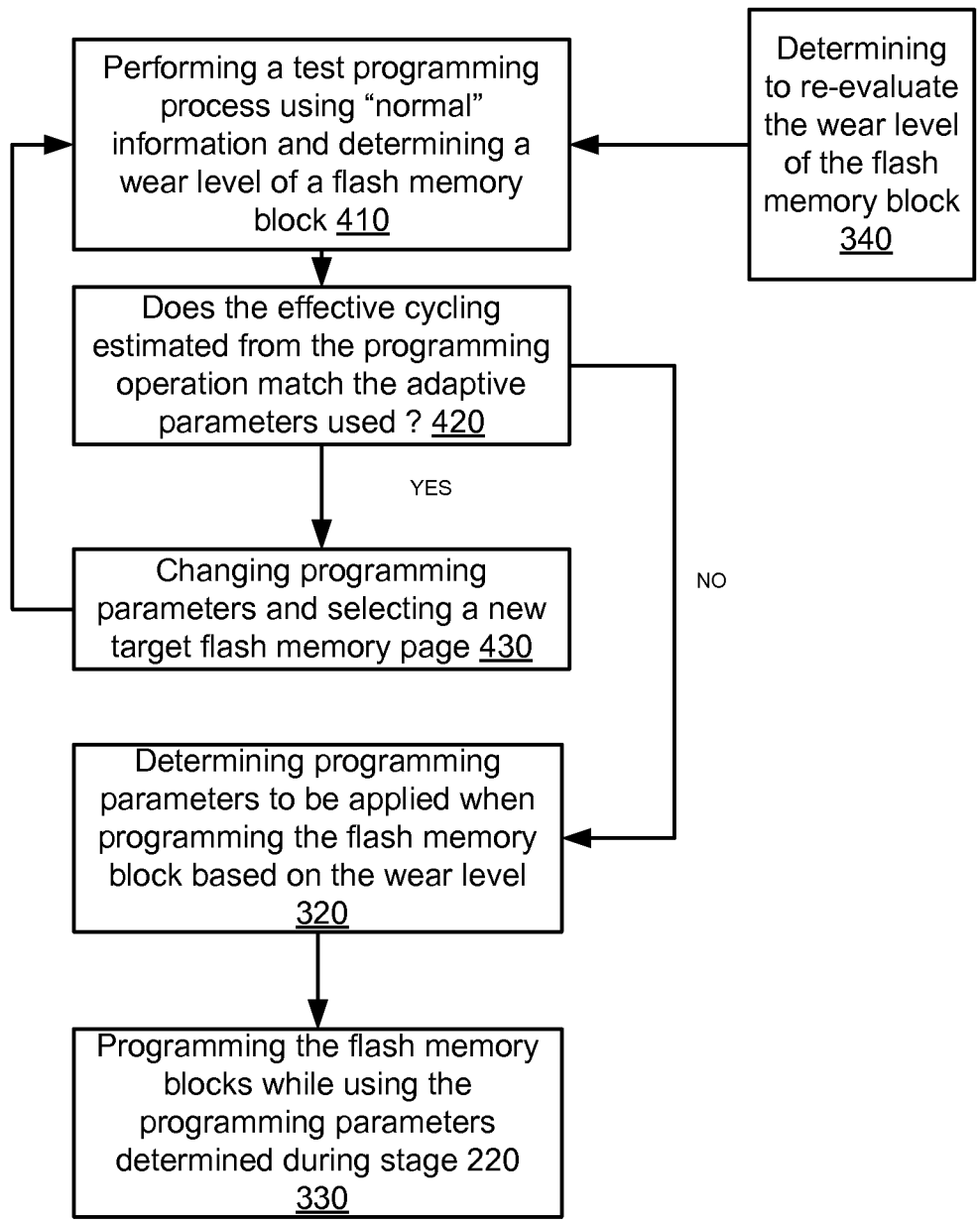
FIG. 4 illustrates a method according to an embodiment of the invention.

FIG. 4 illustrates method 400 according to an embodiment of the invention.

Method 400 starts by stage 410 of performing a test programming process using normal information and determining a wear level of a flash memory block.

Stage 410 is followed by stage 420 of checking whether the effective cycling estimated from the programming operation matches the adaptive parameters used.

If the answer is positive (information was corrupted) then stage 420 is followed by stage 430 of changing programming parameters and selecting a new target flash memory page.

If the answer is negative (the information was not corrupted) then stage 420 is followed by stage 320 of determining programming parameters to be applied when programming the flash memory block based on the wear level.

Stage 320 is followed by stage 330 of programming the flash memory blocks while using the programming parameters determined during stage 320.

Method 400 also includes stage 340 of determining to re-evaluate the wear level of the flash memory block Stage 340 is followed by stage 410. As indicated above the re-evaluation can be triggered in a periodical manner, in a random manner, in response to events and the like.

According to an embodiment of the invention pages of the same block can be calibrated so that their programming speed matches a predefined programming time. The calibration can be executed at the beginning of the lifespan of the flash memory device, and even before the flash memory device is shipped to the customer.

This calibration can include performing a test programming process and changing the programming parameters until the duration of the test programming process reaches the predefined programming time.

It may be assumed that the programming speed of the different pages of the block is the same and that the same (initial) programming parameters can be used in future programming attempts. The predefined programming time can be used as a reference—and the timings of future test programming process can be compared to this reference.

According to various embodiments of the invention the programming parameters applied to the programming of the flash memory device may change over time (for example— in response to wear estimation, program erase cycles values and the like). This may be referred to as adaptive programming.

The calibration process can be applied whenever the adaptive programming requires changing the set of the programming parameters.

The relationship between wear characteristics and the duration of the test programming period can be estimated based upon a mapping process during which multiple test programming processes are executed and their duration is measured at known wear conditions.

These known wear conditions may be provided by repetitively programming and erasing one or more flash memory device pages (or other portions) at known timings (for example—in a continuous manner without major time gaps between program and erase cycles).

The timings of the program and erase cycles can be set to prevent or substantially prevent flash memory device recovery (substantial discharge of trap charges) or to allow predefined amount of discharging.

A group of program/erase cycles and repetitive measurements of the duration of the test programming process can be done for one set of programming characteristics or for each set of programming parameters.

Yet according to another embodiment of the invention the same page can be programmed with different sets of programming parameters. The sets of programming parameters can be the same as those sets that are expected to be applied during the adaptive programming but this is not necessarily so.

During the mapping process many measurements can be obtained—for example for each block of flash memory device being programmed during the mapping process, for each page of each block of the flash memory device being programmed during the mapping process, per each test programming process attempt and the like. These measurements can be processed (for example by applying statistical functions such as averaging) to provide a time to wear mapping. The processing can be applied on measurements of the same page, of pages that belong to the same block and the like.

The size of the time to wear mapping can be a tradeoff between the size and accuracy.

The mapping can include: (a) for every set of programming parameters of the adaptive programming, allocating a range of blocks to be program/erase cycled, wherein the programming include performing a test programming process; (b) After every test programming process recording a measurement result such as an average duration (Tprog) of the test programming process over all pages programmed with the same parameters; (c) creating a time to wear look-up table that maps a Tprog to a program/erase cycle count for every set of programming parameters of the adaptive programming or for at least some of the Tprog obtained during (b).

As indicated above, the size of the time to wear mapping can be a tradeoff. An example of such a tradeoff can be provided if populating the time to wear mapping by boundary values for every set of programming parameters of the adaptive programming, as demonstrated in the following table:

TABLE 1

| Cycle count | First set of programming parameters | Second set of programming parameters | Third set of programming parameters | Fourth set of programming parameters |
|---|---|---|---|---|
| C(0) | T(0, 0) | T(1, 0) | T(2, 0) | T(3, 0) |
| C(1) | T(0, 1) | T(1, 1) | T(2, 1) | T(3, 1) |
| C(2) | T(0, 2) | T(1, 2) | T(2, 2) | 1(3, 2) |
| C(3) | T(0, 3) | T(1, 3) | T(2, 3) | T(3, 3) |
| C(4) | T(0, 4) | T(1, 4) | T(2, 4) | T(3, 4) |
| Cmax | T(0, 5) | T(1, 5) | T(2, 5) | T(3, 5) |

Table 1 includes the estimated programming time according to a cycle count and a programming set. That is, the first set is intended to be used for effective cycling of $C(0) \leq Ceff < C(1)$ corresponding to $T(0,0) < Tprog < T(0,1)$. The second set is intended for $C(1) \leq Ceff < C(2)$ corresponding to $T(1,1) < Tprog < T(1,2)$. The third set is intended for $C(2) \leq Ceff < C(3)$ corresponding to $T(2,2) < Tprog < T(2,3)$. The fourth set is intended for $C(3) \leq Ceff < C(4)$ corresponding to $T(3,3) < Tprog < T(3,4)$.

For example, assuming that the first set is used for effective cycling in the range of $C(0), \ldots, C(1)-1$, then when the average $Tprog <= T(0,1)$ the memory controller will switch the second set of programming parameters.

Yet for another example, assuming that the memory controller uses the third set on the last programming operation. When writing again, possibly after retention, the controller uses the third set of programming parameters and measures an average programming time Tprog in the following range: $T(2,0) \leq Tprog < T(2,1)$. It is then clear that the block had passed a retention, and its effective cycling is smaller than C(1), and therefore can switch and continue programming this block using the first set.

It is noted that if a gap that more that a single set of parameter sis detected between the currently used set of parameters and the desired set of parameters as indicated by a duration of a test programming process then the memory controller can bridge the gap in one or more steps—thus is may change to the desired set of programming parameters or may change the set of parameters to an intermediate set of parameters and only after one or more programming attempts using the intermediate set of parameters (and maybe a measurement of a test programming process) then the memory controller will use the desired set of parameters.

According to an embodiment of the invention the adaptive programming is responsive to a wear characteristic so that the switching between one set of programming to the other is triggered by different values of the wear characteristic.

If, for example, the test programming process does not occurs each program erase cycle then the frequency of the execution of the test programming process can be kept unchanged or may be changes in response to the value of the wear characteristic. Thus, the frequency can increase when reaching a wear characteristic value that requires a change in the set of programming parameters.

Yet according to another embodiment of the invention the selection of which set of programming parameters to apply can be responsive to program erase cycle count and to the wear characteristics measurements. The program erase cycle count can be used to initially determine the set of programming parameters to be used while the wear characteristic measurements can be used to alter these initial determinations. Thus, a set of programming parameters will be selected according to the program/erase count and wear characteristic measurements can result in changing the set of programming parameters.

It is noted that the time to wear mapping can be applied to other sets of programming parameters (not used during the mapping process). This can include interpolation, extrapolation or otherwise processing mapping process results to estimate the results to be provided when using other sets of programming parameters.

Memory Management Based on Wear Estimation

According to an embodiment of the invention a memory management method is provided. The memory management may be based on a wear level estimation. This memory management method may include estimating a wear level of a flash memory blocks and then allocating flash memory pages of these flash memory blocks based on the wear level of the flash memory blocks that include the flash memory pages. The memory management can also include dictating programming parameters of flash memory pages based on the wear level of flash memory blocks that include these flash memory pages.

One memory management method may include "wear balancing"—allocating flash memory blocks that have a lower wear level before allocating flash memory blocks that have a higher wear level. This may allow more worn flash memory blocks to at least partially recuperate.

Another memory management method may include allocating flash memory blocks which suffer from higher levels of wear to short term data storage. For example, they can be allocated for storing data that is identified as cached data. Thus, the effect of retention is less important on those flash memory blocks.

A combination of both memory management methods can be provided.

According to an embodiment of the invention the memory management can also apply at least one memory management scheme that is not responsive to the wear estimation such as applying Error Correction Codes or changing the programming parameters without having knowledge about the wear level of a target flash memory block.

Figure 5:
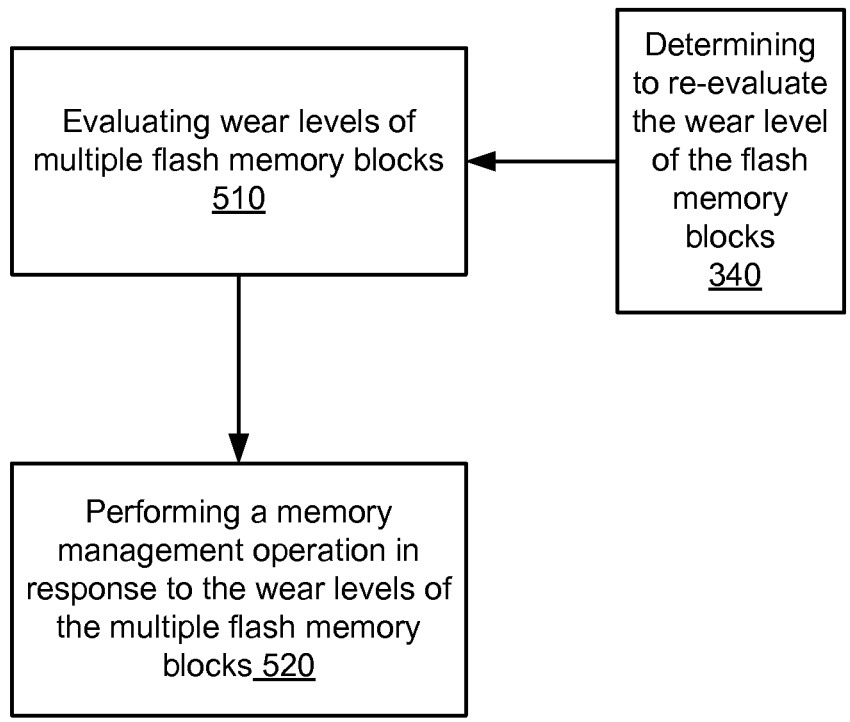
FIG. 5 illustrates a method according to an embodiment of the invention.

FIG. 5 illustrates method 500 according to an embodiment of the invention.

Method 500 starts by stage 510 of evaluating wear levels of multiple flash memory blocks.

Stage 510 is followed by stage 520 of performing a memory management operation in response to the wear levels of the multiple flash memory blocks.

Method 500 also includes stage 340 of determining to re-evaluate the wear level of the flash memory block Stage 340 is followed by stage 510. As indicated above the re-evaluation can be triggered in a periodical manner, in a random manner, in response to events and the like.

Figure 6:
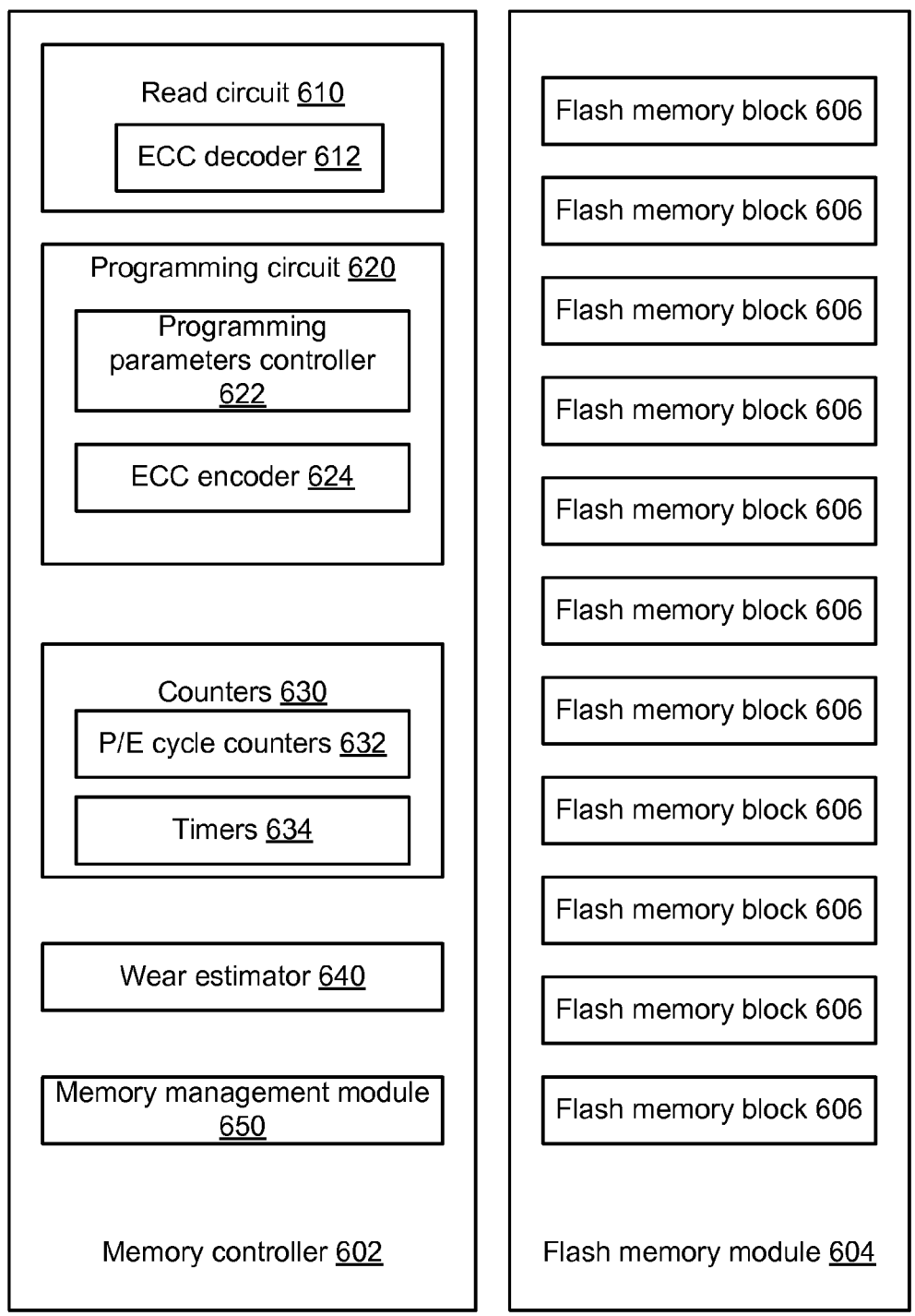
FIG. 6 illustrates a device according to an embodiment of the invention.

FIG. 6 illustrates a device 600 according to an embodiment of the invention.

Device 600 can execute any of the mentioned above methods or a combination of methods.

Device 600 includes a flash memory module 604 and a memory controller 602. The flash memory module 604 includes multiple flash memory blocks 606, each includes multiple flash memory pages (not shown).

The memory controller 602 includes a read circuit 610, a programming circuit 620, counters 630, wear estimator 640 and memory management module 650.

The read circuit 610 includes an ECC decoder 612.

The programming circuit 620 includes an ECC encoder 624 and a programming parameters controller 622.

The counters 630 include program and erase cycle counters 632 "P/E cycle counters" and timers 634.

The program and erase counters 632 count the program and erase cycles per flash memory block.

The timers 634 can measure the duration of test programming processes.

The wear estimator 640 can be arranged to receive timing information about the duration of programming and in response determine the wear level. The determination can be based on a lookup table that maps wear levels to durations of the programming processes.

The memory management module 650 can manage the allocation of flash memory blocks 606 or apply a wear level responsive memory management scheme or another memory management scheme.

The programming parameter controller 622 determines the programming parameters to be applied during normal programming and during test programming processes.

Figure 7:
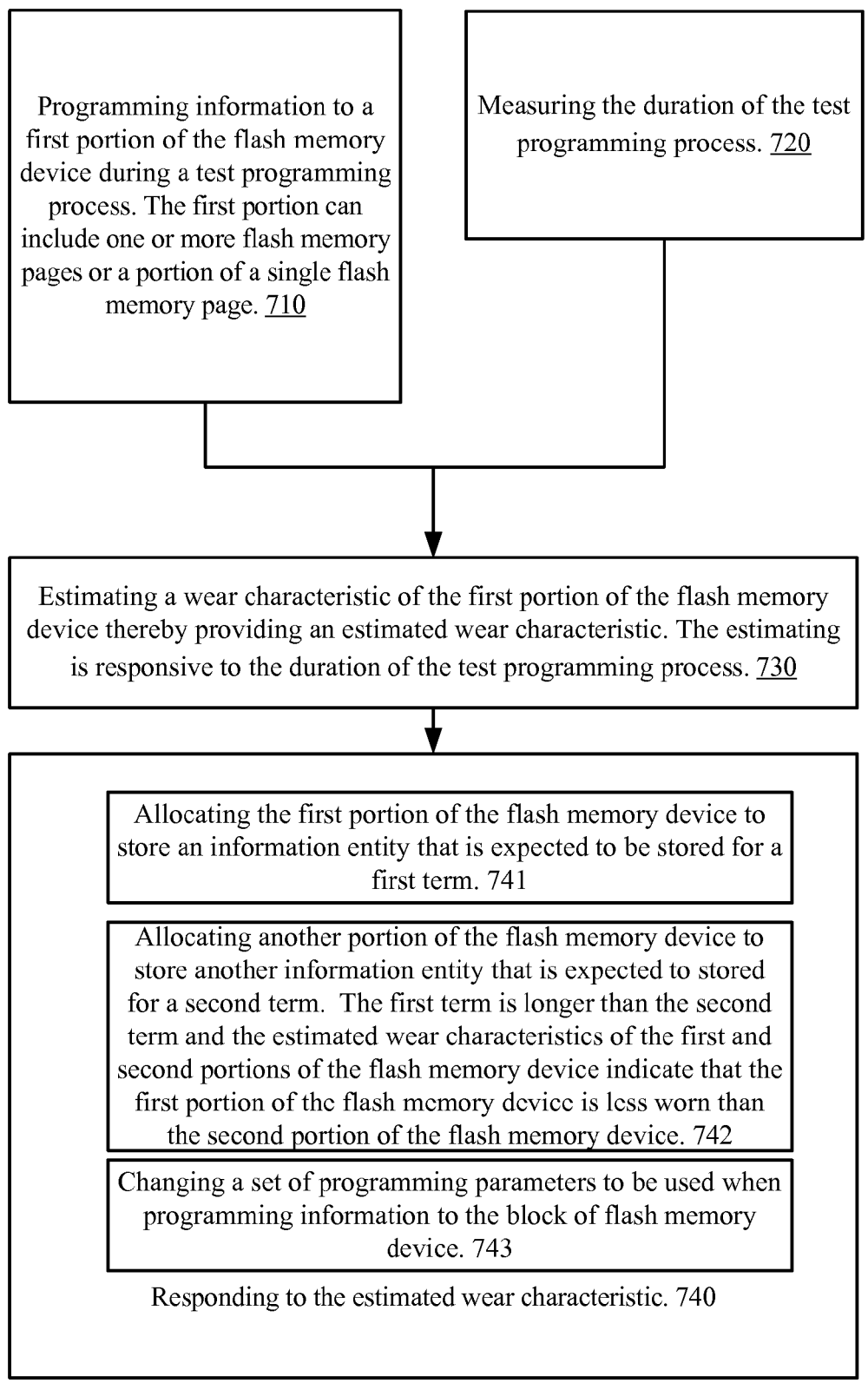
FIG. 7 illustrates a method according to an embodiment of the invention.

FIG. 7 illustrates method 700 according to an embodiment of the invention.

Method 700 starts by stages 710 and 720.

Stage 710 includes programming information to a first portion of the flash memory device during a test programming process. The first portion can include one or more flash memory pages or a portion of a single flash memory page.

The test programming process can be designed as a unique programming operation—dedicated only for estimating the wear characteristic.

The information that is being programmed during the test programming process can be random information having random content or pseudo-random information generated by a pseudo-random process.

The information that is being programmed during the test programming process selected to include a substantially same amount of zero valued bits and one valued bits. It may be of a predefined size that will statistically guarantee that this condition is fulfilled.

The programming of the information may include applying multiple types of programming that differ from each other by significance (such as LSB. CSB and MSB programming).

Stage 710 may include triggering the test programming process in a random or pseudo-random manner.

Stage 710 may include triggering the test programming process in response to events selected from: (a) an occurrence of read errors of data previously programmed to the flash memory device. (b) reaching a predefined number of program and erase cycles of the first portion of the flash memory device, (c) detecting another portion of the flash memory device that has a wear level of a predetermined value, (d) a failure in evaluating a wear level of another portion of the flash memory device, and (e) a success in evaluating a wear level of another portion of the flash memory device.

Stage 710 may include programming information during the test programming process while applying the same programming parameters as those applied during normal programming of non-test information. Alternatively, different parameters can be applied during these different programming processes. The programming parameters may include at least one programming parameter out of an initial programming voltage, an allowable number of programming steps, a bias voltage supplied to flash memory cells that are not programmed, a maximal programming voltage and a programming voltage step.

Stage 710 can include utilizing programming parameters that emphasize differences between wear characteristics of different portions of the flash memory device. For example, timing differences can be easier to notice when using one or more programming parameters that are expected to result in longer programming parameters.

For example—lower Vstart, smaller Vstep and higher Nmaxpulses can result in longer test programming processes.

Additionally or alternatively, programming processes that are of lower significance tend to be longer than programming processes that are of higher significance (this is usually due to the fact that more levels are to be set on an LSB page than on an MSB page, and required distribution of the LSB programmed levels is usually more strict than that of the MSB).

Yet for another example, the test programming process can be aimed to program values aimed to higher lobes that represent higher charge values and are more susceptible to charge traps that result from wear.

Stage 710 may include altering at least one programming parameter during the test programming period.

Stage 720 includes measuring the duration of the test programming process. The measuring can be executed in real time or based upon timing information generated during the test programming process.

Stages 710 and 720 may be followed by stage 730 of estimating a wear characteristic of the first portion of the flash memory device thereby providing an estimated wear characteristic. The estimating is responsive to the duration of the test programming process. The estimating can be also responsive to status information such as program erase cycles of the first portion, timing of program erase cycles of the first portion and especially the timing of the last one or more program erase cycles of the first portion.

Stage 730 can be followed by stage 740 of responding to the estimated wear characteristic.

Stage 740 can include, for example, re-programming information, altering one or more programming parameters, performing a memory management operation such as allocations of flash memory portions, and the like.

Stage 740 may include applying a wear balancing scheme so that flash memory portions that are less worn be allocated for programming before other portions that are less worn.

Stage 740 may include allocating more worn flash memory portions for storing shorter term information.

Stage 740 may include stage 741 of allocating the first portion of the flash memory device to store an information entity that is expected to be stored for a first term.

Stage 740 may include stage 742 of allocating another portion of the flash memory device to store another information entity that is expected to be stored for a second term. The first term is longer than the second term and the estimated wear characteristics of the first and second portions of the flash memory device indicate that the first portion of the flash memory device is less worn than the second portion of the flash memory device.

Stage 740 may include stage 743 of changing a set of programming parameters to be used when programming information to the block of flash memory device.

Multiple repetitions of stages 710-740 that include (stage 740) changing one or more programming parameters can assist in finding programming parameters that emphasize differences between wear characteristics of different portions of the flash memory device.

Figure 8:
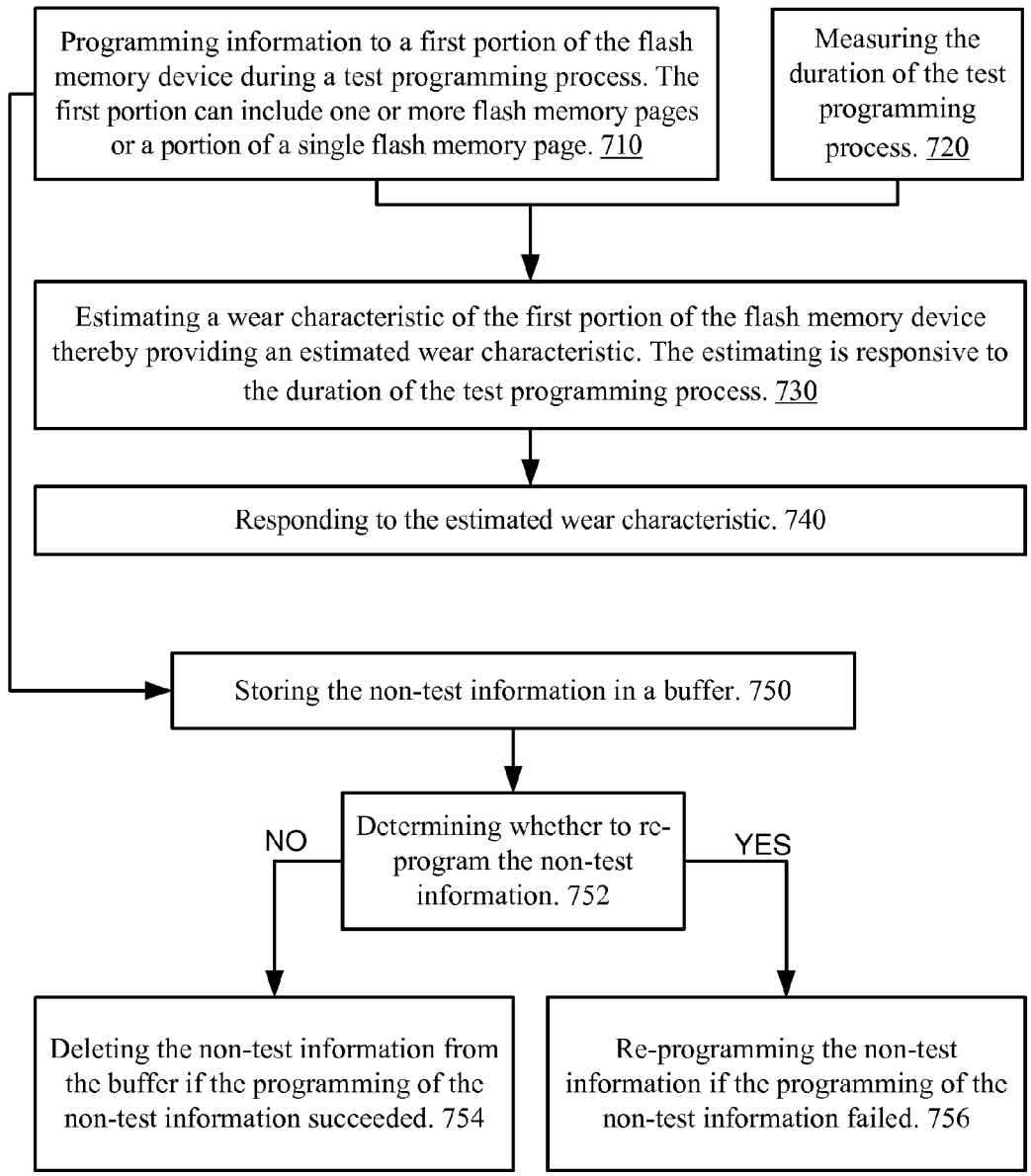
FIG. 8 illustrates a method according to an embodiment of the invention.

FIG. 8 illustrates method 800 for wear estimation according to another embodiment of the invention.

Method 800 differs from method 700 by including stages 750, 752, 754 and 756.

Stage 710 of method 800 may include programming non-test information.

Stage 750 includes storing the non-test information in a buffer. Stage 750 can be executed before stage 710, in parallel to stage 710 of after stage 710.

Stage 752 includes determining whether to re-program the non-test information.

Stage 752 may include checking if the programming of the non-test information succeeded.

Stage 754 includes deleting the non-test information from the buffer if the programming of the non-test information succeeded.

Stage 756 includes re-programming the non-test information if the programming of the non-test information failed.

Stage 756 may include re-programming the non-test information to another portion of the flash memory device.

Stage 756 may include re-programming the non-test information while using at least one programming parameter that differs from a programming parameter used during the programming of the non-test information.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

In the claims, the word "comprising" does not exclude the presence of other elements or steps than those listed in a claim. Furthermore, the terms "a" or "an" as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an" The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method for wear estimation of a flash memory device, the method comprises: programming information to a first portion of the flash memory device during a test programming process; wherein the programming comprises most significant bit (MSB) programming and least significant bit (LSB) programming; measuring a duration of the test programming process; and estimating a wear characteristic of the first portion of the flash memory device thereby providing an estimated wear characteristic, wherein the estimating is responsive to the duration of the test programming process; and triggering the test programming process in response to a failure in evaluating a wear level of another portion of the flash memory device; wherein the first portion and the other portion are different pages of the flash memory device.

2. The method according to claim 1, wherein the information is random information having a random content or pseudo-random information generated by a pseudo-random process.

3. The method according to claim 1, wherein the information is several pages long and is selected to comprise a same amount of zero valued bits and one valued bits.

4. The method according to claim 1, comprising programming non-test information, during a programming process that differs from the test programming process, wherein the programming of the non-test information comprises programming a different number of bit per cell from a number of bit per cell programmed during the test programming process.

5. The method according to claim 1, comprising triggering the test programming process in a random or pseudo-random manner.

6. The method according to claim 1, comprising triggering the test programming process in response to an occurrence of read errors of data previously programmed to the flash memory device.

7. The method according to claim 1, comprising:
programming non-test information, during a non-test programming process, using first programming parameters: and
programming the information, during the test programming process, using second programming parameters that differ from the first programming parameters;
wherein each of the first and second programming parameters is selected from a group consisting of an allowable number of programming steps -and a programming voltage step.

8. The method according to claim 1, wherein the information is non-test information that is scheduled to be programmed to the flash memory module even at an absence of the test programming process.

9. The method according to claim 8, comprising:
programming the non-test information during the test programming process;
storing the non-test information in a buffer;
checking if the programming of the non-test information succeeded;
deleting the non-test information from the buffer if the programming of the non-test information succeeded; and
re-programming the non-test information if the programming of the non-test information failed.

10. The method according to claim 9, comprising re-programming the non-test information to another portion of the flash memory device; wherein the first portion and the other portion are different pages of the flash memory device.

11. The method according to claim 9, comprising re-programming the non-test information while using at least one programming parameter that differs from a programming parameter used during the programming of the non-test information.

12. The method according to claim 9, comprising determining whether to re-program the non-test information in response to the wear characteristic evaluated during the evaluating of the wear characteristic.

13. The method according to claim 8, comprising receiving non-test information to be programmed during the test programming process, wherein the non-test information to be programmed during the test programming process is encoded with an error correction code that is stronger than an error correction code applied on non-test information that is programmed during a non-test programming process.

14. The method according to claim 8, comprising applying a first error correction code to generate non-test information to be programmed during the test programming process; and applying a second error correction code to generate non-test information to be programmed during a non-test programming process; wherein the first error correction code is stronger than the second error correction code.

15. The method according to claim 1, comprising:
programming the information while using first programming parameters;
determining values of third programming parameters based upon the estimated wear characteristic; and
programming additional information while using the third programming parameters.

16. he method according to claim 1, wherein the programming of the information comprises utilization of programming parameters that emphasize differences between wear characteristics of different portions of the flash memory device; wherein the different portions are different pages of the flash memory device.

17. The method according to claim 16, comprising finding programming parameters that emphasize differences between wear characteristics of different portions of the flash memory device.

18. The method according to claim 1, comprising altering at least one programming parameter during the test programming period; wherein the at least one programming parameter is selected from a group consisting of an allowable number of programming steps and a programming voltage step.

19. The method according to claim 1, comprising allocating portions of the flash memory device for programming based upon estimated wear characteristics of the portions of the flash memory device.

20. The method according to claim 19, wherein the allocating comprises applying a wear balancing scheme.

21. The method according to claim 19, wherein the allocating comprises:
allocating the first portion of the flash memory device to store an information entity that is expected to be stored for a first term; and
allocating another portion of the flash memory device to store another information entity that is expected to be stored for a second term; wherein the first portion and the other portion are different pages of the flash memory device;
wherein the first term is longer than the second term and the estimated wear characteristics of the first and second portions of the flash memory device indicate that the first portion of the flash memory device is less worn than the second portion of the flash memory device.

22. The method according to claim 1, selecting programming parameters to be used when programming non-test information in response to the estimated wear characteristic.

23. The method according to claim 1, comprising:
performing multiple sets of test programming processes on multiple portions of the flash memory device in proximity to a beginning of a lifetime of the flash memory device;
wherein different portions of the flash memory devices undergo different amounts of test programming processes; wherein the test programming processes of each set are executed in a continuous manner;
wherein durations of the multiple sets of test programming process are measured to provide multiple durations; and
generating, in response to the multiple durations, a time to wear mapping.

24. The method according to claim 23, comprising selecting, out of the multiple durations, a subset of durations, as a time to wear mapping.

25. The method according to claim 23, comprising executing each set of test programming processes without long idle periods between adjacent test programming processes of the set such as to prevent substantially charge trap discharge.

26. A non-transitory computer readable medium that stores instructions for:
receiving non-test information to be programmed during a test programming process, wherein the non-test information is encoded with an error correction code that is stronger than an error correction code applied on non-test information that is programmed during a non-test programming process;
programming the non-test information to be programmed during the test programming process to a first portion of the flash memory device during the test programming process;
measuring a duration of the test programming process; and
estimating a wear characteristic of at least the first portion of the flash memory device thereby providing an estimated wear characteristic, wherein the estimating is responsive to the duration of the test programming process.

27. A system comprising a memory controller and a flash memory device; wherein the memory controller is arranged to program information to a first portion of the flash memory device during a test programming process; measure a duration of the test programming process; and estimate a wear characteristic of at least the first portion of the flash memory device thereby providing an estimated wear characteristic, wherein the estimate is responsive to the duration of the test programming process and wherein the memory controller is arranged to trigger test programming process in response to a failure in evaluating a wear level of another portion of the flash memory device; wherein the first portion and the other portion are different pages of the flash memory device.

28. The method according to claim 1, comprising triggering the test programming process in response to a success in evaluating a wear level of another portion of the flash memory device; wherein the first portion and the other portion are different pages of the flash memory device.

29. The method according to claim 1, comprising: programming non-test information, during a non-test programming process, using first programming parameters and programming the information, during the test programming process, using second programming parameters that differ from the first programming parameters; wherein each of the first and second programming parameters is a bias voltage supplied to flash memory cells that are not programmed.

30. The method according to claim 1, comprising altering at least one programming parameter during the test programming period; wherein the at least one programming parameter is a bias voltage supplied to flash memory cells that are not programmed.

31. The method according to claim 1 comprising receiving or generating a mapping between estimated wear characteristics values and sets of programming parameters to be used when programming at least non-test data.

32. The method according to claim 31, comprising increasing a frequency of execution of test programming processes when reaching an estimated wear characteristic that requires a change in a set of programming parameters.

* * * * *